US012701847B2

(12) United States Patent
Jung et al.

(10) Patent No.: US 12,701,847 B2
(45) Date of Patent: Aug. 4, 2026

(54) DISPLAY PANEL AND DISPLAY DEVICE INCLUDING THE SAME

(71) Applicant: SAMSUNG ELECTRONICS CO., LTD., Suwon-si (KR)

(72) Inventors: Jinwoo Jung, Suwon-si (KR); Keon Kuk, Suwon-si (KR); Ilju Mun, Suwon-si (KR); Hosuk Kang, Suwon-si (KR); Seongyong Kim, Suwon-si (KR); Ohyun Beak, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 480 days.

(21) Appl. No.: 18/098,487

(22) Filed: Jan. 18, 2023

(65) Prior Publication Data

US 2024/0021657 A1     Jan. 18, 2024

Related U.S. Application Data

(63) Continuation of application No. PCT/KR2023/000759, filed on Jan. 16, 2023.

(30) Foreign Application Priority Data

Jan. 19, 2022   (KR) ........................ 10-2022-0007983
Jul. 25, 2022   (KR) ........................ 10-2022-0091837

(51) Int. Cl.
  *H10H 20/84*      (2025.01)
  *H10H 20/851*     (2025.01)
       (Continued)

(52) U.S. Cl.
  CPC .......... *H10H 29/142* (2025.01); *H10H 20/84* (2025.01); *H10H 20/851* (2025.01); *H10W 90/00* (2026.01)

(58) Field of Classification Search
  CPC .... H10H 29/142; H10H 20/84; H10H 20/851; H01L 25/0753; H10W 90/00
  See application file for complete search history.

(56) References Cited

U.S. PATENT DOCUMENTS 10,048,530 B1 *  8/2018  Kim .................. G02F 1/133514
11,092,841 B2   8/2021  Baek et al.
          (Continued)

FOREIGN PATENT DOCUMENTS

CN       111128051 A      5/2020
CN       111667777 A      9/2020
          (Continued)

OTHER PUBLICATIONS

International Search Report dated Apr. 5, 2023, issued by the International Searching Authority in International Application No. PCT/KR2023/000759 (PCT/ISA/210).
(Continued)

*Primary Examiner* — Eugene Lee
(74) *Attorney, Agent, or Firm* — Sughrue Mion, PLLC

(57) ABSTRACT

A display panel includes a backlight module including a substrate, a first light source member disposed on a surface of the substrate, a second light source member disposed on the surface of the substrate, and a third light source member disposed on the surface of the substrate, a color converter module disposed on the surface of the substrate and including a color converter layer, the color converter layer including a first pixel area corresponding to the first light source member, a second pixel area corresponding to the second light source member, a third pixel area corresponding to the third light source member, and a quantum dot disposed in at least one of the first pixel area, the second pixel area, and the third pixel area, and a first adhesive layer disposed between the color converter module and the backlight module.

17 Claims, 15 Drawing Sheets

(51) Int. Cl.
H10H 29/14          (2025.01)
H10W 90/00          (2026.01)

(56)                References Cited

U.S. PATENT DOCUMENTS

| | | | |
|---|---|---|---|
| 11,709,396 B2 * | 7/2023 | Kim | H10K 59/122 |
| | | | 257/79 |
| 11,737,335 B2 * | 8/2023 | Yoon | H10K 59/8792 |
| | | | 257/91 |
| 2006/0240286 A1 | 10/2006 | Park et al. | |
| 2006/0284532 A1 | 12/2006 | Kurihara et al. | |
| 2010/0219429 A1 * | 9/2010 | Cok | H10K 50/865 |
| | | | 257/89 |
| 2015/0048348 A1 * | 2/2015 | Huang | H10K 59/38 |
| | | | 257/40 |
| 2018/0045866 A1 | 2/2018 | Chae et al. | |
| 2018/0088404 A1 * | 3/2018 | Chae | G02F 1/133617 |
| 2018/0120646 A1 * | 5/2018 | Lee | G02B 5/0236 |
| 2018/0151543 A1 * | 5/2018 | Lee | H01L 25/0753 |
| 2018/0190631 A1 | 7/2018 | Kim et al. | |
| 2019/0137815 A1 | 5/2019 | Kim et al. | |
| 2020/0089047 A1 | 3/2020 | Baek et al. | |
| 2020/0133077 A1 * | 4/2020 | Lin | G02F 1/133609 |
| 2020/0135811 A1 * | 4/2020 | Jung | G02B 1/10 |
| 2020/0287103 A1 | 9/2020 | Maegawa et al. | |
| 2021/0005672 A1 * | 1/2021 | Lee | G02B 5/201 |
| 2021/0217739 A1 | 7/2021 | Lee et al. | |
| 2021/0359081 A1 | 11/2021 | Kong et al. | |
| 2021/0391390 A1 | 12/2021 | Yoon et al. | |
| 2022/0285447 A1 * | 9/2022 | Park | H10K 59/8792 |
| 2022/0390799 A1 * | 12/2022 | Kim | G02F 1/133614 |
| 2022/0397798 A1 * | 12/2022 | Li | G02F 1/133607 |

FOREIGN PATENT DOCUMENTS

| | | | |
|---|---|---|---|
| CN | 212725361 U | | 3/2021 |
| KR | 10-2006-0131649 A | | 12/2006 |
| KR | 10-2010-0081504 A | | 7/2010 |
| KR | 10-1129434 B1 | | 3/2012 |
| KR | 10-2019-0050886 A | | 5/2019 |
| KR | 10-2020-0031750 A | | 3/2020 |
| KR | 10-2020-0135130 A | | 12/2020 |
| KR | 10-2236357 B1 | | 4/2021 |
| KR | 10-2021-0078766 A | | 6/2021 |
| KR | 10-2021-0098207 A | | 8/2021 |
| KR | 10-2021-0098211 A | | 8/2021 |
| KR | 10-2291493 B1 | | 8/2021 |
| KR | 10-2021-0138834 A | | 11/2021 |
| KR | 10-2022-0125985 A | | 9/2022 |
| WO | 2019/099833 A1 | | 5/2019 |
| WO | 2020/0116207 A1 | | 6/2020 |
| WO | 2020/175843 A1 | | 9/2020 |
| WO | 2021/107698 A1 | | 6/2021 |

OTHER PUBLICATIONS

Written Opinion dated Apr. 5, 2023, issued by the International Searching Authority in International Application No. PCT/KR2023/000759 (PCT/ISA/237).

Communication dated Jan. 21, 2025, issued by the European Patent Office in European Application No. 23743430.3.

Communication issued Oct. 15, 2025 by Intellectual Property India in Indian Patent Application No. 202447057998.

Communication issued Oct. 30, 2025 by the European Patent Office in European Patent Application No. 23743430.3.

Communication issued on Jan. 11, 2026 by the Korean Ministry of Intellectual Property in Korean Patent Application No. 10-2022-0091837.

* cited by examiner

DISPLAY PANEL AND DISPLAY DEVICE INCLUDING THE SAME

CROSS-REFERENCE TO RELATED APPLICATIONS

This application is a continuation of International Application No. PCT/KR2023/000759 designating the United States, filed on Jan. 16, 2023, in the Korean Intellectual Property Receiving Office and claiming priority to Korean Patent Application No. 10-2022-0007983, filed on Jan. 19, 2022, in the Korean Intellectual Property Office, and to Korean Patent Application No. 10-2022-0091837, filed on Jul. 25, 2022, in the Korean Intellectual Property Office, the disclosures of all of which are incorporated by reference herein in their entireties.

BACKGROUND

1. Field

The disclosure relates to a display panel and a display device including the same.

2. Description of Related Art

A color converter layer is a component of a display device and is also called a color film or a color filter. A display device displays a color image or video in such a manner as to color-convert the incident light emitted from a light source member of the display device into at least one of red, green, or blue while passing through the color converter layer to thereby implement a pixel.

Research and development has been conducted on display devices with enhanced luminance, resolution, and color expression of the display screen as technology advances. There is a technical need for a color converter layer structure capable of preventing light leakage to adjacent subpixels and enhancing color gamut and contrast ratio to implement vivid colors.

A display panel or display device including three-color micro LEDs of red, green, or blue may extend the display by connecting or combining a plurality of display modules. Such a display panel or display device may secure a larger display but, due to the optical deviation or optical structure resultant from adopting micro LEDs, may experience light leakage at the border between the display modules or seam visibility between the display modules.

SUMMARY

According to various embodiments of the disclosure, there may be provided a display panel and a display device including the same, which may prevent light leakage or seams.

According to various embodiments of the disclosure, there may be provided a display panel which is enlarged through a stacked structure of color converter modules in various sizes and a backlight module and a display device including the same.

The disclosure is not limited to the foregoing embodiments but various modifications or changes may rather be made thereto without departing from the spirit and scope of the disclosure.

According to an aspect of the disclosure, a display panel may include a backlight module including a substrate, a first light source member disposed on a surface of the substrate, a second light source member disposed on the surface of the substrate and adjacent to the first light source member, and a third light source member disposed on the surface of the substrate and adjacent to the second light source member, a color converter module disposed on the surface of the substrate and including a color converter layer, the color converter layer including a first pixel area corresponding to the first light source member, a second pixel area corresponding to the second light source member, a third pixel area corresponding to the third light source member, and a quantum dot disposed in at least one of the first pixel area, the second pixel area, and the third pixel area, and a first adhesive layer disposed between the color converter module and the backlight module and having a first thickness. The first thickness may be smaller than a first distance between the first pixel area and the second light source member. Each of the first light source member, the second light source member, and the third light source member may be configured to emit light in substantially a same wavelength band.

The first thickness may be smaller than a second distance which is a distance between the second light source member and the third pixel area.

The first distance and the second distance may be substantially a same with each other.

The first thickness may be a designated thickness in a first direction, and the first distance may be a designated distance in a second direction perpendicular to the first direction.

The first distance may be 4.8 to 9.3 times the first thickness.

The color converter layer may further include a first barrier rib member configured to divide the first pixel area, the second pixel area, and the third pixel area, and the first barrier rib member may have a second thickness larger than the first thickness.

At least one of the first pixel area, the second pixel area, and the third pixel area may include a color converter including a photosensitive resin and the quantum dot, and at least a portion of the color converter may have a third thickness larger than the second thickness.

At least one of the first pixel area, the second pixel area, and the third pixel area may include a color converter including a photosensitive resin and the quantum dot, and at least a portion of the color converter may have a third thickness smaller than the second thickness.

The color converter module may further include a color filter layer disposed on the color converter layer, and the color filter layer further may include a first color area corresponding to the first pixel area, a second color area corresponding to the second pixel area, a third color area corresponding to the third pixel area, a second barrier rib member configured to divide the first color area, the second color area, and the third color area, and a color filter disposed in at least one of the first color area, the second color area, and the third color area.

The color converter module may further include a transparent coating layer disposed between the color converter layer and the color filter layer.

The color converter module may further include a cover glass disposed on the color filter layer.

The backlight module may include a first cross-sectional area in a first plane direction which is a plane direction perpendicular to a first direction which is a thickness direction of the display panel, the color converter module may include a second cross-sectional area in the first plane direction, and a size of the second cross-sectional area may be substantially a same as a size of the first cross-sectional area or larger than a size of the first cross-sectional area.

The backlight module may include a first backlight module and a second backlight module disposed adjacent to the first backlight module, and the color converter module may include a first color converter module disposed on the first backlight module and a second color converter module disposed on the second backlight module.

The backlight module may include a first backlight module and a second backlight module disposed adjacent to the first backlight module, and at least a portion of the color converter module may be disposed on the first backlight module, and a remaining portion of the color converter module may be disposed on the second backlight module.

The color converter module may include a first color converter module and a second color converter module disposed adjacent to the first color converter module, and at least a portion of the backlight module may be disposed on the first color converter module, and a remaining portion of the backlight module may be disposed on the second color converter module.

According to various embodiments of the disclosure, a display panel may comprise a backlight module including a substrate, a first light source member disposed on a surface of the substrate, a second light source member disposed on the surface of the substrate and adjacent to the first light source member, and a third light source member disposed on the surface of the substrate and adjacent to the second light source member, a color converter layer disposed on the surface of the substrate and including a first pixel area corresponding to the first light source member and configured to convert a wavelength band of light emitted from the first light source member, a second pixel area corresponding to the second light source member, and a third pixel area corresponding to the third light source member and configured to convert a wavelength band of light emitted from the third light source member, and a color filter layer disposed on a surface of the color converter layer and including a first color filter corresponding to the first pixel area and a second color filter corresponding to the third pixel area. Each of the first light source member, the second light source member, and the third light source member may be configured to emit light in substantially a same wavelength band.

The display panel may further include a first adhesive layer disposed between the backlight module and the color converter layer and configured to adhere the backlight module to the color converter layer, and a thickness of the first adhesive layer may be smaller than a distance between the first pixel area and the second light source member.

The display panel may further include a cover glass disposed on the color filter layer, and a transparent coating layer disposed between the color filter layer and the cover glass.

Each of the first light source member, the second light source member, and the third light source member includes a blue micro LED configured to emit light in a blue wavelength band, the first pixel area may include a first quantum dot configured to convert a wavelength band of light emitted from the first light source member into a red wavelength band or a green wavelength band, and the third pixel area may include a second quantum dot configured to convert a wavelength band of light emitted from the third light source member into a green wavelength band or a red wavelength band.

According to various embodiments of the disclosure, a display device may comprise a backlight module including a substrate, a first light source member disposed on a surface of the substrate, a second light source member disposed on the surface of the substrate and adjacent to the first light source member, and a third light source member disposed on the surface of the substrate and adjacent to the second light source member, a color converter module disposed on the surface of the substrate and including a color converter layer, the color converter layer including a first pixel area corresponding to the first light source member, a second pixel area corresponding to the second light source member, a third pixel area corresponding to the third light source member, and a quantum dot disposed in at least one of the first pixel area, the second pixel area, and the third pixel area, and a first adhesive layer disposed between the color converter module and the backlight module and having a first thickness. The first thickness may be smaller than a first distance which is a distance between the first pixel area and the second light source member. Each of the first light source member, the second light source member, and the third light source member may be configured to emit light in substantially a same wavelength band.

According to various embodiments of the disclosure, it is possible to easily manufacture display panels with a wide display (or display area) and display devices by providing a stacked structure (or bonded structure) of a modularized color converter member and a modularized backlight member.

According to various embodiments of the disclosure, there may be proposed a structure for restricting the path of the light emitted from any one light source member (e.g., micro LED) in a color converter member and a backlight module stacked thereon from being introduced into another light source member (e.g., micro LED).

Effects of the disclosure are not limited to the foregoing, and other unmentioned effects would be apparent to one of ordinary skill in the art from the following description.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
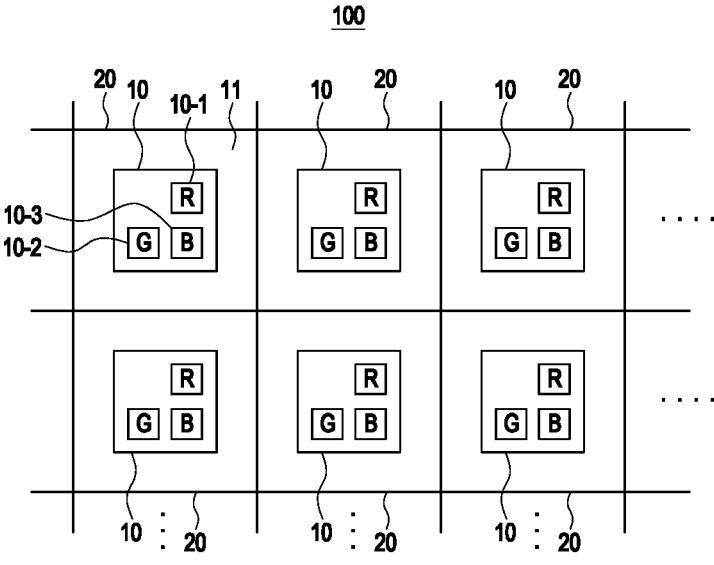
FIG. 1 is a view illustrating a pixel structure of a display device according to various embodiments of the disclosure.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

FIG. 1 is a view illustrating a pixel structure of a display device according to various embodiments of the disclosure.

Referring to FIG. 1, a display device 100 may include a plurality of pixels 10 disposed in a matrix form.

According to various embodiments, the display device 100 may be configured as a single unit and be installed and applied to electronic products, such as wearable devices, portable devices, handheld devices, and mobile devices or wireless communication devices requiring various displays, or electric equipment. According to an embodiment, the display device 100 may be implemented as a television (TV). According to another embodiment, the display device 100 may be applied, without limitations, to any device having a display function, such as video walls, large format displays (LFDs), digital signage, digital information displays (DIDs), or projector displays. According to another embodiment, the display device 100 may be implemented in a matrix type of multiple display modules (or display panels) which are assembled and arranged to be applicable to various display devices, such as personal computer (PC) monitors, high-definition TVs, signage (or digital signage), and/or electronic displays.

According to various embodiments, the display device 100 may include a plurality of pixels 10 disposed in a matrix form. Each of the plurality of pixels 10 may include a plurality of pixel areas 10-1 to 10-3 corresponding to subpixels. For example, each of the plurality of pixels 10 may include a first pixel area 10-1 which is a red (R) subpixel, a second pixel area 10-2 which is a green (G) subpixel, and a third pixel area 10-3 which is a blue (B) subpixel. For example, the plurality of pixel areas 10-1 to 10-3 composed of (or formed of) an R subpixel, a G subpixel, and a B subpixel may form one set, configuring one unit pixel 10 of the display device 100.

According to various embodiments, although it is described that the plurality of pixel areas 10-1 to 10-3 are arranged in the order of R, G, and B, it is not so arranged in practice. In the description of the disclosure, the plurality of pixel areas 10-1 to 10-3 are denoted by R, B, and G, respectively, but this is merely for convenience of description, and the actual order in which the light emitting elements, driving circuits or such elements are arranged may be the same or different.

According to various embodiments, one pixel area 20 of the display device 100 may include an area occupied by one pixel 10 formed of the plurality of pixel areas 10-1 to 10-3 and a remaining area 11 around the one pixel 10. For example, as shown, the area occupied by one pixel 10 may be divided into the areas constituted of the pixel areas 10-1 to 10-3 which are the R, G, and B subpixels and the remaining area 11. According to various embodiments, the remaining area 11 around the area occupied by the pixel 10 may include another driving circuit for driving a plurality of light source members therein.

Figure 3:
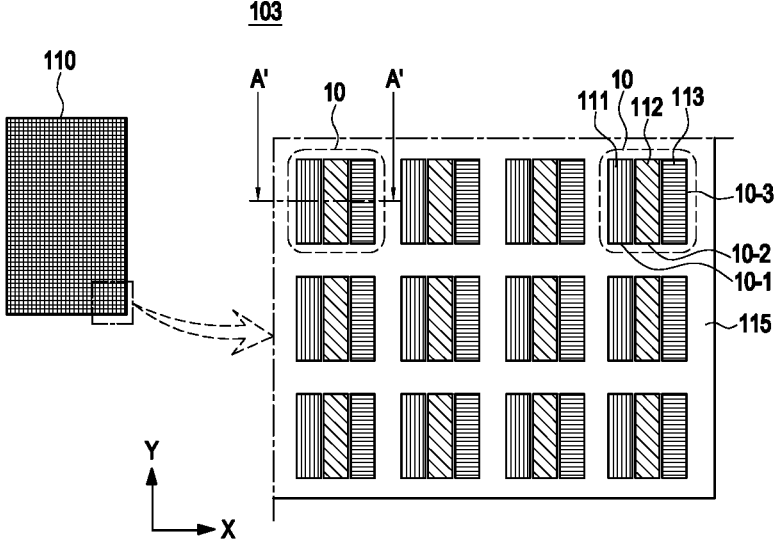
FIG. 3 is a view illustrating a color converter layer according to various embodiments of the disclosure.

According to various embodiments, FIG. 1 illustrates that the plurality of pixel areas 10-1 to 10-3 in one pixel 10 are arranged in a left-right reversed L shape but, without limitations thereto, as shown in FIG. 3, the R, G, and B pixel areas 10-1 to 10-3 may be arranged in a row inside the pixel 10 or may have other various arrangements in the pixel 10.

According to various embodiments, the embodiments of the disclosure describe that the pixel 10 includes the plurality of pixel areas 10-1 to 10-3 formed of three types of subpixels but, without limitations thereto, the pixel 10 may be implemented with four types of subpixels, e.g., R, G, B, and W (white), or a different number of subpixels may form one pixel 10. Described below is an example in which the pixel 10 is formed of three types of subpixels, e.g., R, G, and B for convenience of description.

Figure 2:
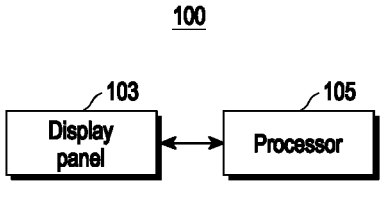
FIG. 2 is a block diagram illustrating a display device 100 according to various embodiments of the disclosure.

FIG. 2 is a block diagram illustrating a display device 100 according to various embodiments of the disclosure.

Referring to FIG. 2, a display device 100 (e.g., the display device 100 of FIG. 1) may include a display panel 103 and/or a processor 105.

The configuration of the display device 100 of FIG. 2 may be identical in whole or part to the configuration of the display device 100 of FIG. 1.

According to various embodiments, the display panel 103 may be implemented in various types of displays, such as a liquid crystal display (LCD), a quantum dot (QD) display panel, an organic light-emitting diode (OLED), a liquid crystal on silicon (LCoS), a digital light processing (DLP), quantum dot light-emitting diodes (QLEDs), micro light-emitting diodes (μLEDs) or mini LEDs. According to various embodiments, the display panel 103 may be implemented as a touchscreen combined with touch sensors, a flexible display, a rollable display, a 3D display, or a display in which a plurality of display modules (or panels) are physically connected.

According to various embodiments, the display device 100 may display various images. The concept of 'image' here encompasses still images or videos. The display device 100 may display various images, such as broadcast content or multimedia content. Further, the display device 100 may also display a user interface (UI) and icons.

According to various embodiments, the display panel 103 may include an IC chip, and the IC chip may display an image based on the image signal received from the processor 105. As an example, the IC chip may generate driving signals for a plurality of light source members based on the image signal received from the processor 105 and control light emission of the plurality of pixels included in the display panel 103 based on the driving signals to display an image.

According to various embodiments, the display panel 103 may further include a driving circuit that may be implemented in the form of an a-si TFT, a low temperature poly silicon (LTPS) TFT, or an organic TFT (OTFT), and a backlight unit (or module).

According to various embodiments, the processor 105 controls the overall operation of the display device 100. According to an embodiment, the processor 105 may include one or a plurality of processors. For example, the processor 105 may perform the operation of the display device 100 according to various embodiments of the disclosure by executing at least one instruction stored in memory.

According to an embodiment, the processor 105 may be implemented as a digital signal processor (DSP), a microprocessor, a graphics processing unit (GPU), an artificial intelligence (AI) processor, a neural processing unit (NPU), or a time controller (TCON) for processing digital image signals. However, without limitations thereto, the processor 105 may include one or more of a central processing unit (CPU), a micro controller unit (MCU), a micro processing unit (MPU), a controller, an application processor (AP), a communication processor (CP), or an ARM processor, or may be defined in a corresponding term. Further, the processor 105 may be implemented as a system on chip (SoC) embedding a processing algorithm or large scale integration (LSI) or be implemented in the form of an application specific integrated circuit (ASIC) or field programmable gate array (FPGA).

According to an embodiment, the processor 105 may drive an operating system or application program to control hardware or software components connected to the processor 105 and may process or compute various data. Further, the processor 105 may load a command or data received from at least one of other components on a volatile memory, process the command or data, and store various data in the non-volatile memory.

FIG. 3 is a view illustrating a color converter layer according to various embodiments of the disclosure.

Figure 4:
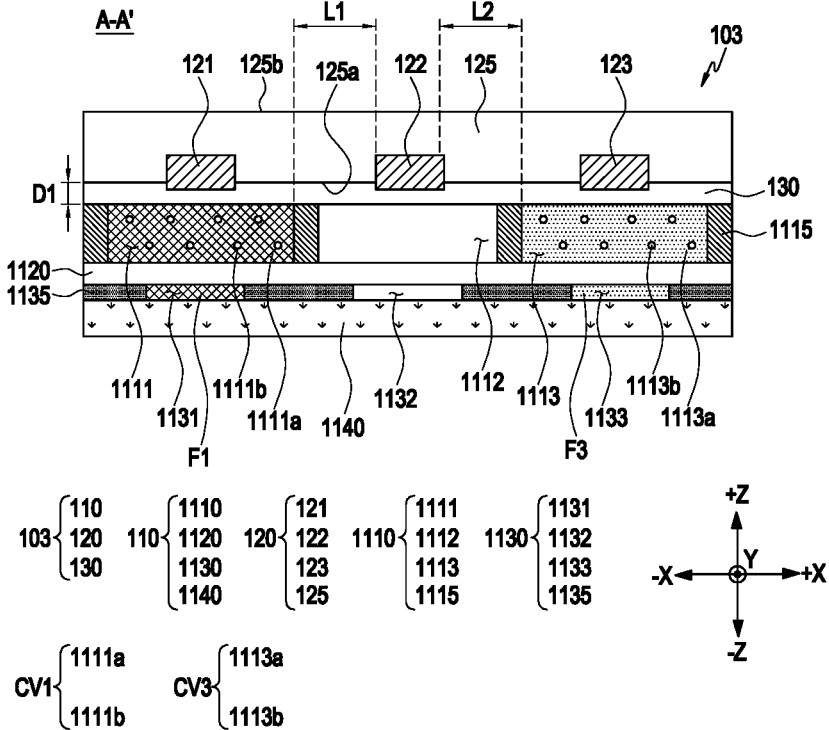
FIG. 4 is a cross-sectional view illustrating a display panel according to various embodiments of the disclosure.

Referring to FIG. 3, a display panel 103 of a display device (e.g., the display device 100 of FIGS. 1 and 2) may include a color converter module 110 and a backlight module (e.g., the backlight module 112 of FIG. 4).

The configuration of the display panel 103 of FIG. 3 may be identical in whole or part to the configuration of the display panel 103 of FIG. 2.

According to various embodiments, the display panel 103 of the display device 100 may include the color converter module 110 and implement a plurality of pixels 10 through the color converter module 110.

According to various embodiments, each of the plurality of pixels 10 may include a plurality of pixel areas 10-1 to 10-3. Each of the plurality of pixel areas 10-1 to 10-3 may emit light of one color among a first color, a second color and a third color that are different from each other. For example, the plurality of pixel areas 10-1 to 10-3 may constitute one pixel 10. For example, each of the plurality of pixels 10 may include a first pixel area 10-1 composed of a first subpixel emitting light of the first color, a second pixel area 10-2 composed of a second subpixel emitting light of the second color, and a third pixel area 10-3 composed of a third subpixel emitting light of the third color. According to an embodiment, the first pixel area 10-1, the second pixel area 10-2, and the third pixel area 10-3 may be implemented as a red (R) subpixel, a green (G) subpixel, and a blue (B) subpixel, respectively.

According to various embodiments, the plurality of pixel areas 10-1 to 10-3 may be implemented in various ways depending on the type of display panel 103 and the type of a plurality of light source members. For example, the first pixel area 10-1 may include a first color converter 111 and convert the color of incident light incident from a light source member into a first color. For example, the second pixel area 10-2 may include a second color converter 112 and convert the color of incident light incident from a light source member into a second color. For example, the third pixel area 10-3 may include a third color converter 113 and convert the color of incident light incident from a light source member into a third color. According to another embodiment, it may also be implemented that the first pixel area 10-1 includes the first color converter 111, the second pixel area 10-2 includes the second color converter 112, and the third pixel area 10-3 does not include a separate color converter. According to another embodiment, the third color of the third pixel area 10-3 may correspond to the color of the light emission of the light source member.

According to various embodiments, the plurality of pixels 10 may be disposed in a matrix form. Each of the plurality of pixel areas 10-1 to 10-3 may be disposed in a matrix form. According to an embodiment, the first pixel area 10-1, the second pixel area 10-2, and the third pixel area 10-3 included in one pixel 10 may be disposed in a row direction in a matrix form. (e.g., horizontal direction or X-axis direction). According to an embodiment, the first pixel area 10-1, the second pixel area 10-2, and the third pixel area 10-3, together with their respective adjacent first pixel area 10-1, second pixel area 10-2, and third pixel area 10-3, may be disposed in a row in a column direction (e.g., vertical direction or Y-axis direction) in a matrix form. According to another embodiment, the first pixel area 10-1, the second pixel area 10-2, and the third pixel area 10-3 included in one pixel 10 each may be disposed in a row in a column direction (e.g., vertical direction or Y-axis direction) in a matrix form.

According to various embodiments, the color converter module 110 may include a barrier rib member 115 configured to divide the first pixel area 10-1, the second pixel area 10-2, and the third pixel area 10-3.

FIG. 4 is a cross-sectional view illustrating a display panel according to various embodiments of the disclosure. FIG. 4 is a cross-sectional view taken along line A-A' of FIG. 3 according to various embodiments of the disclosure. Hereinafter, in FIGS. 4 to 12B, the shown X-axis direction may be defined and/or interpreted as the width direction of the display panel 103 and the components of the display panel 103, the shown Y-axis direction may be defined and/or interpreted as the length direction of the display panel 103 and the components of the display panel 103, and the Z-axis direction may be defined and/or interpreted as the thickness direction and/or height direction of the display panel 103 and the components of the display panel 103.

Referring to FIG. 4, the display panel 103 (e.g., the display panel 103 of FIGS. 2 and 3) may include a color converter module 110, a backlight module 120, and a first adhesive layer 130.

The configuration of the color converter module 110 of FIG. 4 may be identical in whole or part to the configuration of the color converter module 110 of FIG. 3.

According to various embodiments, the backlight module 120 may include a substrate 125, a first light source member 121, a second light source member 122, and a third light source member 123.

According to various embodiments, the first adhesive layer 130 may be disposed between the color converter module 110 and the backlight module 120. According to an embodiment, the first adhesive layer 130 may protect a plurality of light source members 111, 112, and 113 and adhere the backlight module 120 to the color converter module 110. According to an embodiment, the first adhesive layer 130 may include an optical clear adhesive (OCA), an optical adhesive film, or an optical clear resin (OCR).

According to various embodiments, the substrate 125 may include a thin film transistor (TFT) substrate and may contain glass, metal or organic material. According to an embodiment, the substrate 125 may include a first surface 125a facing the cover glass 1140 and a second surface 125b facing in the direction opposite to the first surface 125a. According to an embodiment, the first surface 125a may face in a 1-1th direction (e.g., −Z-axis direction of FIG. 4) of first direction (e.g., the Z-axis direction of FIG. 4) which is the thickness direction of the display panel 103, and the second surface 125b may face in a 1-2th direction (e.g., the +Z-axis direction of FIG. 4) which is the direction opposite to the 1-1th direction of the first direction (e.g., the Z-axis direction of FIG. 4) which is the thickness direction of the display panel 103. According to various embodiments, the first light source member 121, the second light source member 122, and the third light source member 123 may be disposed on the first surface 125a of the substrate 125. According to various embodiments, the substrate 125 may include a driving circuit for controlling the first light source member 121, the second light source member 122, and the third light source member 123 or a power supply line and receive signals (or control signals) by the processor (e.g., the processor 105 of FIG. 2) to thereby control the plurality of light source members. According to an embodiment, the substrate 125 may include at least one thin film transistor and may include a gate line and/or a data line respectively for applying a gate signal and/or a data signal.

According to various embodiments, the first light source member 121 may be disposed on the first surface 125a of the substrate 125. According to an embodiment, the first light source member 121 may be disposed on the first surface 125a of the substrate 125 or at least a portion of the first light source member 121 may be disposed in the first surface 125a of the substrate 125. According to an embodiment, the first light source member 121 may include a blue micro LED which emits incident light having a blue wavelength band.

According to an embodiment, the first light source member 121 may include an ultraviolet (UV) micro LED which emits incident light having a UV wavelength band. For example, the incident light emitted from the first light source member 121 may pass through the first pixel area 1111, the first color area 1131, and/or the cover glass 1140.

According to various embodiments, the second light source member 122 may be disposed on the first surface 125a of the substrate 125 and adjacent to the first light source member 121. According to an embodiment, the second light source member 122 may be disposed on the first surface 125a of the substrate 125 or at least a portion of the second light source member 122 may be disposed in the first surface 125a of the substrate 125. According to an embodiment, the second light source member 122 may include a blue micro LED which emits incident light having a blue wavelength band. According to an embodiment, the second light source member 122 may include an ultraviolet (UV) micro LED which emits incident light having a UV wavelength band. For example, the incident light emitted from the second light source member 122 may pass through the second pixel area 1112, the second color area 1132, and/or the cover glass 1140.

According to various embodiments, the third light source member 123 may be disposed on the first surface 125a of the substrate 125 and adjacent to the second light source member 122. According to an embodiment, the third light source member 123 may be disposed on the first surface 125a of the substrate 125 or at least a portion of the third light source member 123 may be disposed in the first surface 125a of the substrate 125. According to an embodiment, the third light source member 123 may include a blue micro LED which emits incident light having a blue wavelength band. According to an embodiment, the third light source member 123 may include an ultraviolet (UV) micro LED which emits incident light having a UV wavelength band. For example, the incident light emitted from the third light source member 123 may pass through the third pixel area 1113, the third color area 1133, and/or the cover glass 1140.

According to various embodiments, the color converter module 110 (e.g., the color converter module 110 of FIG. 3) may be stacked on the backlight module 120. According to an embodiment, the color converter module 110 may be stacked on the first surface 125a of the substrate 125. According to an embodiment, the backlight module 120 (e.g., the first surface 125a of the substrate 125) may be adhered to the color converter module 110 through the first adhesive layer 130.

According to various embodiments, the color converter module 110 may include a color converter layer 1110, a transparent coating layer 1120, a color filter layer 1130, and the cover glass 1140.

According to various embodiments, the color converter layer 1110 may include the first pixel area 1111 (e.g., the first pixel area 10-1 of FIG. 3), the second pixel area 1112 (e.g., the second pixel area 10-2 of FIG. 3), the third pixel area 1113 (e.g., the third pixel area 10-3 of FIG. 3), and/or a first barrier rib member 1115 (e.g., the barrier rib 115 of FIG. 3). According to an embodiment, the color converter layer 1110 may be a component to be coupled and/or connected with the backlight module 120.

According to various embodiments, the first barrier rib member 1115 may be configured to divide the first pixel area 1111, the second pixel area 1112, and the third pixel area 1113. According to an embodiment, the first barrier rib member 1115 may include an opaque inorganic insulating material, such as CrOx, MoOx, or carbon black, or an opaque organic insulating material, such as black resin. The first barrier rib member 1115 may be implemented as a black matrix (BM). According to an embodiment, the first pixel area 1111, the second pixel area 1112, and the third pixel area 1113 may be interpreted as openings formed in the first barrier rib member 1115.

According to various embodiments, the first pixel area 1111 may be positioned to correspond to the first light source member 121. According to an embodiment, the first pixel area 1111 may include a first color converter CV1 including a first photosensitive resin 1111a and a first quantum dot 1111b. According to an embodiment, the first photosensitive resin 1111a may include a light-transmissive material, such as, e.g., silicone resin, epoxy resin, acrylate, siloxane-based or light-transmissive organic material. According to an embodiment, the first quantum dot 1111b may include a quantum dot (QD) that absorbs incident light and emits the light isotropically. For example, the incident light in the blue wavelength band or the incident light in the ultraviolet wavelength band emitted from the first light source member 121 may be absorbed by the first quantum dot 1111b and be then emitted as light having a longer wavelength band (e.g., red wavelength band). According to an embodiment, the first color converter CV1 may further include scattering particles. For example, the scattering particles may scatter the incident light that is not absorbed by the first quantum dot 1111b and excite more first quantum dots 1111b by the incident light.

According to various embodiments, the third pixel area 1113 may be positioned to correspond to the third light source member 123. According to an embodiment, the third pixel area 1113 may include a third color converter CV3 including a third photosensitive resin 1113a and a third quantum dot 1113b. According to an embodiment, the third photosensitive resin 1113a may include a light-transmissive material, such as, e.g., silicone resin, epoxy resin, acrylate, siloxane-based or light-transmissive organic material. For example, the third photosensitive resin 1113a may be substantially the same material as the first photosensitive resin 1111a. According to an embodiment, the third quantum dot 1113b may include a quantum dot (QD) that absorbs incident light and emits the light isotropically. For example, the incident light in the blue wavelength band or the ultraviolet wavelength band emitted from the third light source member 1113 may be absorbed by the third quantum dot 1113b and be then emitted as light having a longer wavelength band (e.g., green wavelength band). According to an embodiment, the third color converter CV3 may further include scattering particles. For example, the scattering particles may scatter the incident light that is not absorbed by the third quantum dot 1113b and excite more third quantum dots 1113b by the incident light.

According to various embodiments, the second pixel area 1112 may be positioned to correspond to the second light source member 122. According to an embodiment, the second pixel area 1112 may be formed of a transmissive layer. According to an embodiment, the second pixel area 1112 may be formed of an empty space. According to an embodiment, the second pixel area 1112 may include a second photosensitive resin, and the second photosensitive resin may include a light-transmissive material, such as, e.g., silicone resin, epoxy resin, acrylate, siloxane-based or light-transmissive organic material. For example, the second photosensitive resin may be substantially the same material as the first photosensitive resin 1111a and/or the third photosensitive resin 1113b. According to an embodiment, the second pixel area 1112 may transmit, e.g., incident light in a blue wavelength band as it is.

According to an embodiment, the display panel 103 may include quantum dots in the second pixel area 1112. The second pixel area 1112 may convert incident light in an ultraviolet wavelength band into light in a blue wavelength band and emit the light.

According to an embodiment, the first light source member 121, the second light source member 122, and the third light source member 123 may include a blue micro LED configured to emit light in a blue wavelength band. According to an embodiment, the first pixel area 1111 may convert the light incident from the first light source member 121 into light in a red wavelength band and emit the light. The second pixel area 1112 may emit the light incident from the second light source member 122 as light in the blue wavelength band. The third pixel area 1113 may emit the light incident from the third light source member 123 as light in a green wavelength band. According to an embodiment, the wavelength band of the incident light passing through the first pixel area 1111, the second pixel area 1112, and the third pixel area 1113 may vary according to a design change. For example, the wavelength band of the light passing through the first pixel area 1111 may be a blue wavelength band or a green wavelength band.

According to various embodiments, the transparent coating layer 1120 may be disposed between the color converter layer 1110 and the color filter layer 1130. According to an embodiment, the transparent coating layer 1120 may include at least one of a transparent organic material layer or a transparent inorganic material layer. According to an embodiment, the transparent organic material layer may include, but is not limited to, at least one of an acrylic-based transparent organic material layer, a urethane-based transparent organic material layer, a silicon-based transparent organic material layer, a polyethylene terephthalate (PET)-based transparent material, a polyethylene naphthalate (PEN)-based transparent organic material layer, a polyimide-based transparent organic material layer, a polyethylene sulfonate-based transparent organic material layer, a benzo-cyclobutene-based transparent organic material layer, or a hexamethyldisiloxane-based transparent organic material layer. According to an embodiment, the transparent inorganic material layer may include, but is not limited to, at least one of a silicon oxide-based transparent inorganic material layer, a silicon oxynitride-based transparent inorganic material layer, an indium tin oxide (ITO)-based transparent inorganic material layer, an indium tin oxide (IZO)-based transparent inorganic material layer, or an indium zinc oxide (ZnO)-based transparent inorganic material layer.

According to various embodiments, the color filter layer 1130 may be stacked on the color converter layer 1110. According to various embodiments, the color filter layer 1130 may include the first color area 1131, the second color area 1132, the third color area 1133, and a second barrier rib member 1135.

According to various embodiments, the second barrier rib member 1135 may be configured to divide the first color area 1131, the second color area 1132, and the third color area 1133. According to an embodiment, the second barrier rib member 1135 may include an opaque inorganic insulating material, such as CrOx, MoOx, or carbon black, or an opaque organic insulating material, such as black resin. The second barrier rib member 1135 may be implemented as a black matrix (BM). According to an embodiment, the first color area 1131, the second color area 1132, and the third color area 1133 may be interpreted as openings formed in the second barrier rib member 1135.

According to various embodiments, the first color area 1131 may be positioned to correspond to the first pixel area 1111. According to an embodiment, the first color area 1131 may include a first color filter F1. According to an embodiment, the first color filter F1 may be disposed in the first color area 1131 and may be a filter including color pixels. For example, the first color filter F1 may include a polarizing member and may be a filter that selectively passes light in a designated wavelength band among light incident to the first color filter F1 and absorbs light in the remaining wavelength bands. For example, the first color filter F1 may transmit light in the red wavelength band among light passing through the first pixel area 1111 and absorb light in the other wavelength bands than the red wavelength band among light passing through the first pixel area 1111.

According to various embodiments, the second color area 1132 may be positioned to correspond to the second pixel area 1112. According to an embodiment, the second color area 1132 may be formed of an empty space. According to another embodiment, the second color area 1132 may include a transmissive film that transmits light passing through the second pixel area 1112 as it is.

According to various embodiments, the third color area 1133 may be positioned corresponding to the third pixel area 1113. According to an embodiment, the third color area 1133 may include a third color filter F3. According to an embodiment, the third color filter F3 may be disposed in the third color area 1133 and may be a filter including color pixels. For example, the third color filter F3 may include a polarizing member and may be a filter that selectively passes light in a designated wavelength band among light incident to the third color filter F3 and absorbs light in the remaining wavelength bands. For example, the third color filter F3 may transmit light in the green wavelength band among light passing through the third pixel area 1113 and absorb light in the other wavelength bands than the green wavelength band among light passing through the first pixel area 1113.

According to various embodiments, the cover glass 1140 may be stacked on the color filter layer 1130. According to an embodiment, the cover glass 1140 may include an insulating material including any one of a transparent substrate, glass, plastic, transparent film, or crystal through which the light passing through the color converter layer 1110 and/or the color filter layer 1130 may be transmitted.

According to various embodiments, the first adhesive layer 130 may have a first thickness D1 in a first direction (e.g., the Z-axis direction of FIG. 4) that is the thickness direction of the display panel 103. According to an embodiment, the first thickness D1 may be about 3.8 um (micro meter) to about 6.3 um (micro meter).

According to various embodiments, the incident light emitted from the first light source member 121 may have a path passing through the first pixel area 1111 and the first color area 1131. For example, if the first thickness D1 is designed to be too large, the incident light emitted from the first light source member 121 may be introduced into the second pixel area 1112 or the third pixel area 1113, i.e., light leakage may occur. According to an embodiment, the first thickness D1 may have various thicknesses at which the incident light emitted from the first light source member 121 is introduced only to the first pixel area 1111.

According to various embodiments, the second light source member 122 may be disposed between the first light source member 121 and the third light source member 123.

According to various embodiments, the second light source member 122 may be spaced apart from the first pixel area 1111 by a first distance L1 and may be spaced apart from the third pixel area 1113 by a second distance L2.

According to various embodiments, the first distance L1 and/or the second distance L2 may be a designated distance in the second direction (e.g., the X-axis direction of FIG. 4) perpendicular to the first direction (e.g., the Z-axis direction of FIG. 4). For example, the first distance L1 and/or the second distance L2 may be a designated (or measured) minimum distance in a first plane direction (e.g., the direction of the plane including the X axis and the Y axis of FIG. 4) which is perpendicular to the first direction (e.g., the Z-axis direction of FIG. 4).

According to various embodiments, the first thickness D1 may be smaller than the first distance L1 and/or the second distance L2. According to an embodiment, the first distance L1 may be about 35.8 um (micro meter) to about 40.1 um (micro meter). The second distance L2 may be substantially equal to the first distance L1.

According to various embodiments, the length of the first distance L1 and/or the second distance L2 may be about 4.8 to about 9.3 times the length of the first thickness D1.

Figure 5A:
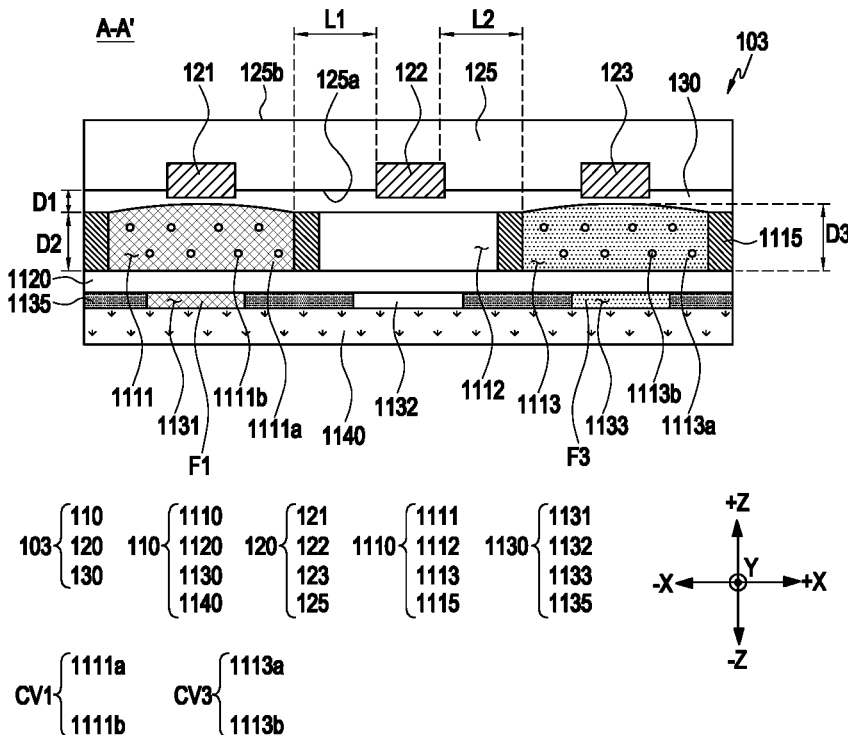
FIG. 5A is a cross-sectional view illustrating a display panel according to various embodiments of the disclosure.

FIG. 5A is a cross-sectional view illustrating a display panel according to various embodiments of the disclosure. FIG. 5A is a cross-sectional view taken along line A-A' of FIG. 3 according to various embodiments of the disclosure.

Referring to FIG. 5A, the display panel 103 (e.g., the display panel 103 of FIGS. 2 and 3) may include a color converter module 110, a backlight module 120, and a first adhesive layer 130.

The configuration of the color converter module 110, the backlight module 120, and the first adhesive layer 130 of FIG. 5A may be identical in whole or part to the configuration of the color converter module 110, the backlight module 120, and the first adhesive layer 130 of FIG. 4.

According to various embodiments, the display panel 103 may include a first color converter CV1 (e.g., the first color converter CV1 of FIG. 4) and/or a third color converter CV3 (e.g., the third color converter CV3 of FIG. 4).

According to various embodiments, at least a portion of at least one of the first color converter CV1 and/or the third color converter CV3 may have a third thickness D3 in the first direction (e.g., the Z-axis direction of FIG. 5A). For example, at least a portion (e.g., the portion facing in the +Z direction of FIG. 5A) of at least one of the first color converter CV1 and/or the third color converter CV3 may have a convex shape. The third thickness D3 may be the largest among the thicknesses of at least one of the first color converter CV1 and/or the third color converter CV3.

According to various embodiments, the first barrier rib member 1115 (e.g., the first barrier rib member 1115 of FIG. 5A) may have a second thickness D2 in the first direction (e.g., the Z-axis direction of FIG. 5A).

According to an embodiment, the first barrier rib member 1115, the first color converter CV1, and the third color converter CV3 have first ends (e.g., the ends facing in the −Z direction of FIG. 5A) continuously connected to form a plane.

According to an embodiment, the third thickness D3 may be larger than the first thickness D1 (e.g., the first thickness D1 of FIG. 4). According to an embodiment, the third thickness D3 may be larger than the second thickness D2. According to an embodiment, the second thickness D2 may be larger than the first thickness D1. According to an embodiment, the third thickness D3 may be smaller than the sum of the first thickness D1 and the second thickness D2.

According to an embodiment, as the first color converter CV1 and/or the third color converter CV3 fills the limited space to the third thickness D3 which is the maximum thickness (or height), the color gamut of the incident light emitted from the first light source member 121 (e.g., the first light source member 121 of FIG. 4) and/or the third light source member 123 (e.g., the third light source member 123 of FIG. 4) may be enhanced.

Figure 5B:
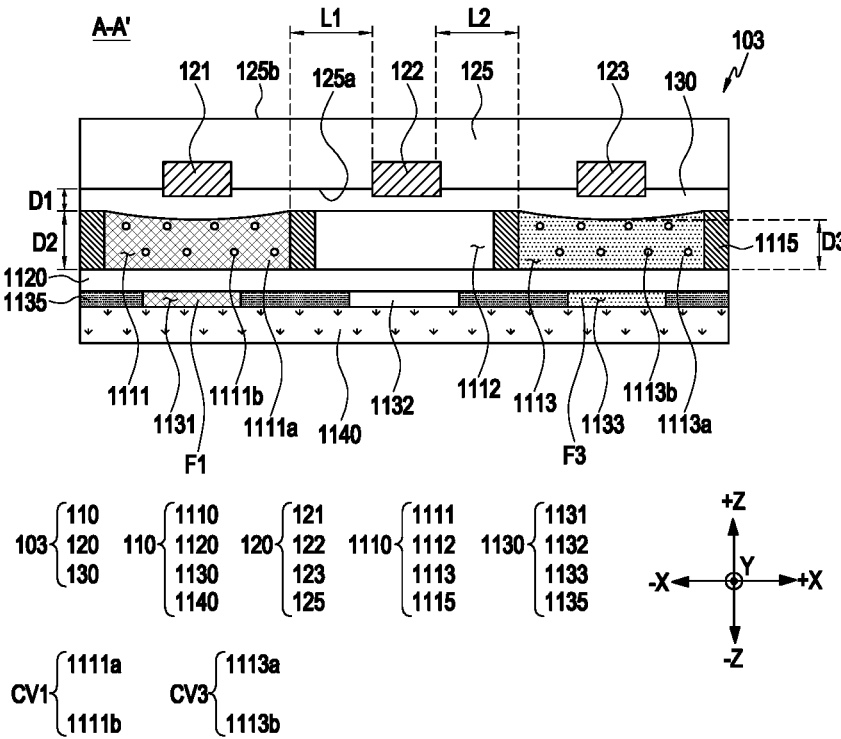
FIG. 5B is a view illustrating a display panel according to various embodiments of the disclosure.

FIG. 5B is a cross-sectional view illustrating a display panel according to various embodiments of the disclosure. FIG. 5B is a cross-sectional view taken along line A-A' of FIG. 3 according to various embodiments of the disclosure.

Referring to FIG. 5B, the display panel 103 (e.g., the display panel 103 of FIGS. 2 and 3) may include a color converter module 110, a backlight module 120, and a first adhesive layer 130.

The configuration of the color converter module 110, the backlight module 120, and the first adhesive layer 130 of FIG. 5B may be identical in whole or part to the configuration of the color converter module 110, the backlight module 120, and the first adhesive layer 130 of FIG. 4.

According to various embodiments, the display panel 103 may include a first color converter CV1 (e.g., the first color converter CV1 of FIG. 4) and/or a third color converter CV3 (e.g., the third color converter CV3 of FIG. 4).

According to various embodiments, at least a portion of at least one of the first color converter CV1 and/or the third color converter CV3 may have a third thickness D3 in the first direction (e.g., the Z-axis direction of FIG. 5B). For example, at least a portion (e.g., the portion facing in the +Z direction of FIG. 5B) of at least one of the first color converter CV1 and/or the third color converter CV3 may have a concave shape. The third thickness D3 may be the smallest among the thicknesses of at least one of the first color converter CV1 and/or the third color converter CV3.

According to various embodiments, the first barrier rib member 1115 (e.g., the first barrier rib member 1115 of FIG. 5B) may have a second thickness D2 in the first direction (e.g., the Z-axis direction of FIG. 5B).

According to an embodiment, the first barrier rib member 1115, the first color converter CV1, and the third color converter CV3 have first ends (e.g., the ends facing in the −Z direction of FIG. 5B) continuously connected to form a plane.

According to an embodiment, the third thickness D3 may be larger than the first thickness D1 (e.g., the first thickness D1 of FIG. 4). According to an embodiment, the third thickness D3 may be smaller than the second thickness D2. According to an embodiment, the second thickness D2 may be larger than the first thickness D1.

According to an embodiment, as the first color converter CV1 and/or the third color converter CV3 fills the limited space to the third thickness D3, the color gamut of the incident light emitted from the first light source member 121 (e.g., the first light source member 121 of FIG. 4) and/or the third light source member 123 (e.g., the third light source member 123 of FIG. 4) may be enhanced.

Figure 6:
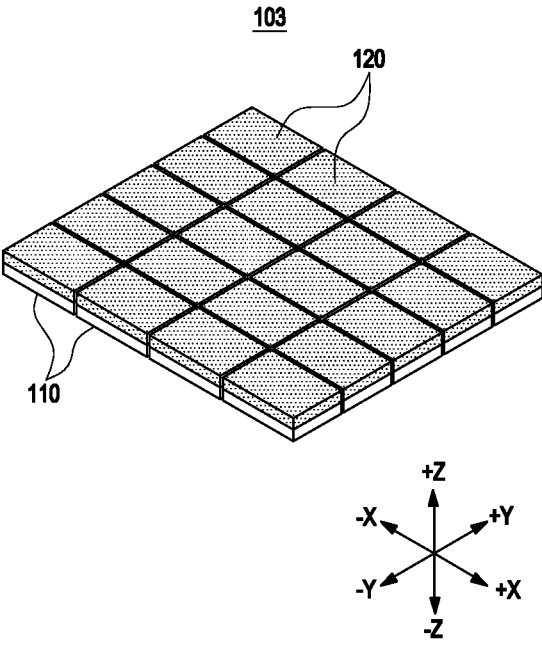
FIG. 6 is a perspective view illustrating a stacked state of a backlight module and a color converter module according to various embodiments of the disclosure.

FIG. 6 is a perspective view illustrating a stacked state of a backlight module and a color converter module according to various embodiments of the disclosure.

Referring to FIG. 6, a display panel 103 (e.g., the display panel 103 of FIGS. 2 to 5A) may include a backlight module 120 and/or a color converter module 110.

The configuration of the backlight module 120 and/or the color converter module 110 of FIG. 6 may be identical in whole or part to the configuration of the backlight module 120 and/or the color converter module 110 of FIGS. 4 and 5A.

According to various embodiments, the display panel 103 may include a plurality of backlight modules 120 (e.g., the backlight module 120 of FIGS. 4 and 5A) and a plurality of color converter modules 110 (e.g., the color converter module 110 of FIGS. 4 and 5A) which are the same in number as the plurality of backlight modules 120.

According to an embodiment, the display panel 103 may be manufactured by bonding the plurality of backlight modules 120 to the plurality of color converter modules 110 through a first adhesive layer (e.g., the first adhesive layer 130 of FIGS. 4 and 5A) and then tiling the bonded color converter modules 110 and backlight modules 120.

According to an embodiment, each of the plurality of backlight modules 120 may have a first cross-sectional area in the first plane direction (e.g., the direction of the plane including the X axis and the Y axis of FIG. 6) which is perpendicular to the first direction (e.g., the Z-axis direction of FIG. 6) which is the thickness direction of the display panel 103.

According to an embodiment, each of the plurality of color converter modules 110 may have a second cross-sectional area in the first plane direction (e.g., the direction of the plane including the X axis and the Y axis of FIG. 6).

According to an embodiment, the second cross-sectional area of the color converter module 110 may be substantially the same as the first cross-sectional area of the backlight module 120.

Figure 7:
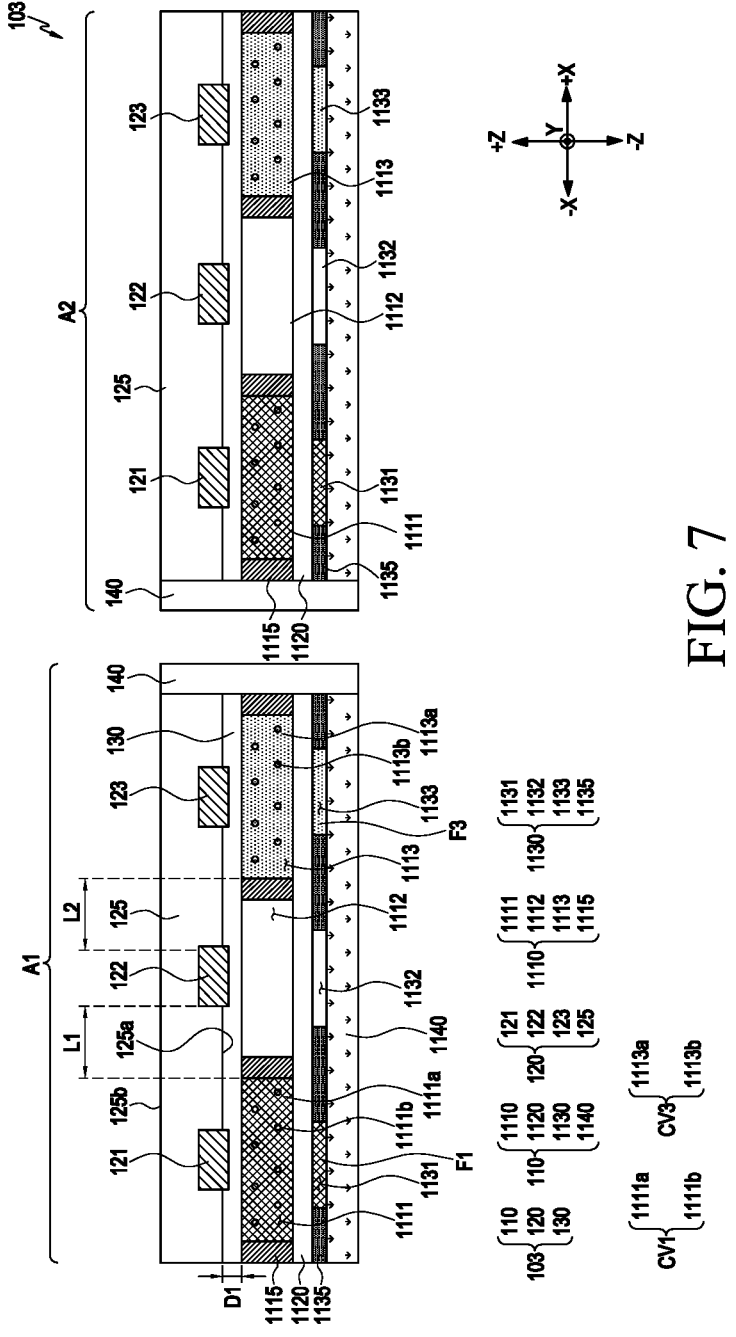
FIG. 7 is a cross-sectional view illustrating a coupled state of a backlight module and a color converter module according to various embodiments of the disclosure.

FIG. 7 is a cross-sectional view illustrating a coupled state of a backlight module and a color converter module according to various embodiments of the disclosure.

Referring to FIG. 7, a display panel 103 (e.g., the display panel 103 of FIGS. 2 and 6) may include a backlight module 120, a color converter module 110, and a first adhesive layer 130.

The configuration of the backlight module 120, the color converter module 110, and the first adhesive layer 130 of FIG. 7 may be identical in whole or part to the configuration of the backlight module 120, the color converter module 110, and the first adhesive layer 130 of FIG. 4.

According to various embodiments, the backlight module 120 (e.g., the backlight module 120 of FIG. 4) may include a first backlight module 120 (e.g., the backlight module 120 in portion A1 of FIG. 7) and a second backlight module 120 (e.g., the backlight module 120 in portion A2 of FIG. 7) disposed adjacent to the first backlight module 120 (e.g., the backlight module 120 in portion A1 of FIG. 7).

According to various embodiments, the color converter module 110 (e.g., the color converter module 110 of FIG. 4) may include a first color converter module 110 (e.g., the color converter module 110 in portion A1 of FIG. 7) stacked on the first backlight module 120 and a second color converter module 110 (e.g., the color converter module 110 in portion A2 of FIG. 7) stacked on the second backlight module 120.

According to an embodiment, the cross-sectional areas of the backlight module 120 and the color converter module 110 corresponding to each other in the first plane direction (e.g., the direction of the plane including the X axis and the Y axis of FIG. 7) perpendicular to the first direction (e.g., the Z-axis direction of FIG. 7) which is the thickness direction of the display panel 103 may be substantially the same in size as each other.

According to an embodiment, the display panel 103 may be formed of a combination of a plurality of backlight modules 120 and a plurality of color converter modules 110 respectively stacked on the plurality of backlight modules 120. According to an embodiment, the first backlight module 120 (e.g., the backlight module 120 in portion A1) and the first color converter module 110 (e.g., the first color converter module 110 in portion A1) bonded to the first backlight module 120 may be spaced apart from its adjacent second backlight module 120 (e.g., the backlight module 120 in portion A2) and the second color converter module 110 (e.g., the second color converter module 110 in portion A2) bonded thereto, by a designated distance. According to an embodiment, the first backlight module 120 (e.g., the backlight module 120 in portion A1) and the first color converter module 110 (e.g., the first color converter module 110 in portion A1) bonded to the first backlight module 120 may not be spaced apart from its adjacent second backlight module 120 (e.g., the backlight module 120 in portion A2) and the second color converter module 110 (e.g., the second color converter module 110 in portion A2) bonded to the second backlight module 120.

According to an embodiment, a boundary layer 140 may be disposed between the first backlight module 120 (e.g., the backlight module 120 in portion A1) and the first color converter module 110 (e.g., the first color converter module 110 in portion A1) bonded to the first backlight module 120 and its adjacent second backlight module 120 (e.g., the backlight module 120 in portion A2) and the second color converter module 110 (e.g., the second color converter module 110 in portion A2) bonded to the second backlight module 120. According to an embodiment, the boundary layer 140 may be formed of an organic layer having moisture resistance or an inorganic layer having moisture resistance. According to an embodiment, the boundary layer 140 may be coupled to a side of the backlight module 120 and/or the color converter module 110, restricting inflow of an external foreign object and/or liquid to the side of the backlight module 120 and/or the color converter module 110.

Figure 8A:
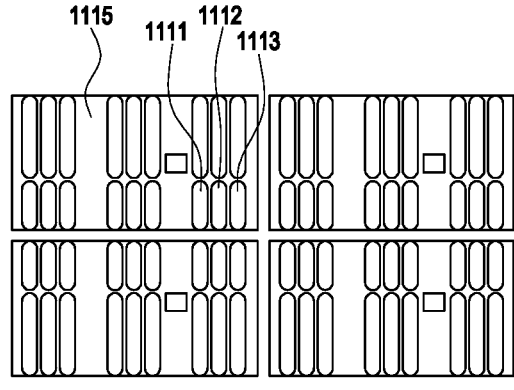
FIG. 8A is a view illustrating pixel areas of a display panel according to various embodiments of the disclosure.
Figure 8B:
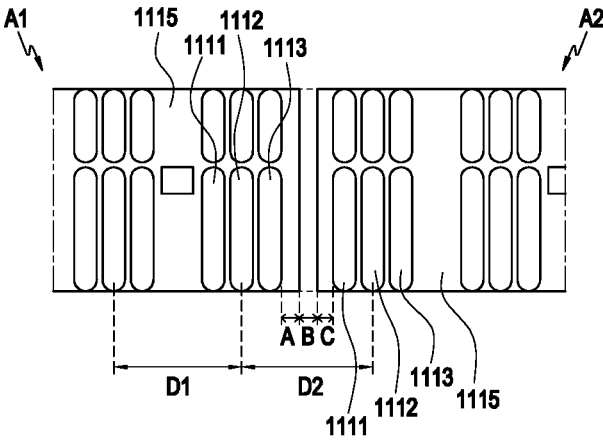
FIG. 8B is a view illustrating a spacing between pixel areas of a display panel according to various embodiments of the disclosure.

FIG. 8A is a view illustrating pixel areas of a display panel according to various embodiments of the disclosure. FIG. 8B is a view illustrating a spacing between pixel areas of a display panel according to various embodiments of the disclosure.

Referring to FIGS. 8A and/or 8B, a display panel (e.g., the display panel 103 of FIG. 3) may include a first barrier rib member 1115 (e.g., the barrier rib member 115 of FIG. 3 or the first barrier rib member 1115 of FIG. 4) and a first pixel area 1111 (e.g., the first pixel area 10-1 of FIG. 3 or the first pixel area 1111 of FIG. 4), a second pixel area 1112 (e.g., the second pixel area 10-2 of FIG. 3 or the second pixel area 1112 of FIG. 4) and a third pixel area 1113 (e.g., the third pixel area 10-3 of FIG. 3 or the third pixel area 1113 of FIG. 4) divided by the first barrier rib member 1115.

According to an embodiment, one first barrier rib member 1115 may form a plurality of first pixel areas 1111, a plurality of second pixel areas 1112, and a plurality of third pixel areas 1113. According to an embodiment, one first barrier rib member 1115 may be a component of one color converter module (e.g., the color converter module 110 of FIG. 4).

According to an embodiment, one first barrier rib member 1115 may be disposed adjacent to another first barrier rib member 1115. According to an embodiment, among the pixel areas formed by one first barrier rib member 1115, pixel areas positioned close to the adjacent first barrier rib member 1115 may be shorter than the other pixel areas.

Referring to FIG. 8B, any one of first barrier rib members 1115 (e.g., the first barrier rib member 1115 in portion A1 of FIG. 8B) may be disposed adjacent to another first barrier rib member 1115 (e.g., the second barrier rib member 1115 in portion A2 of FIG. 8B).

According to an embodiment, in any one first barrier rib member 1115 (e.g., the first barrier rib member 1115 in portion A1 of FIG. 8B), the spacing between the parallel second pixel areas 1112 may be a designated first spacing D1. According to an embodiment, the spacing between the second pixel area 1112 of any one first barrier rib member 1115 (e.g., the first barrier rib member 1115 in portion A1 of FIG. 8B) and the second pixel area 1112 of its adjacent first barrier rib member 1115 (e.g., the second barrier rib member 1115 in portion A2 of FIG. 8B) may be a designated second spacing D2. According to an embodiment, the first spacing D1 may be substantially the same as the second spacing D2.

According to an embodiment, the distance between the third pixel area 1113 of any one first barrier rib member 1115 (e.g., the first barrier rib member 1115 in portion A1 of FIG. 8B) and an end of the first barrier rib member 1115 may be a first distance A, the distance between the first pixel area 1111 of another first barrier rib member 1115 (e.g., the first barrier rib member 1115 in portion A2 of FIG. 8B) and an end of the first barrier rib member 1115 may be a third distance C, and the distance between any one first barrier rib member (e.g., the first barrier rib member 1115 in portion A1 of FIG. 8B) and another first barrier rib member (e.g., the first barrier rib member 1115 in portion A2 of FIG. 8B) may be a second distance B.

According to an embodiment, the sum of the first distance A, the second distance B, and the third distance C may be smaller than the first spacing D1 and/or the second spacing D2.

Figure 9:
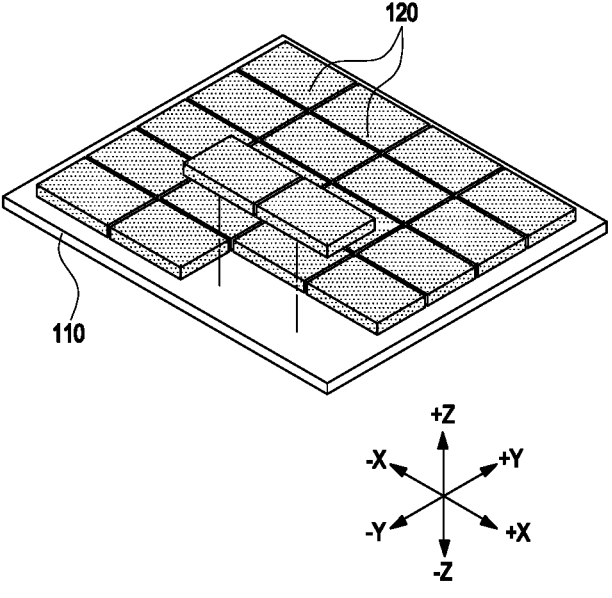
FIG. 9 is a perspective view illustrating a stacked state of a backlight module and a color converter module according to various embodiments of the disclosure.

FIG. 9 is a perspective view illustrating a stacked state of a backlight module and a color converter module according to various embodiments of the disclosure.

Referring to FIG. 9, a display panel 103 (e.g., the display panel 103 of FIGS. 2 to 5A) may include a backlight module 120 and/or a color converter module 110.

The configuration of the backlight module 120 and/or the color converter module 110 of FIG. 9 may be identical in whole or part to the configuration of the backlight module 120 and/or the color converter module 110 of FIGS. 4 and 5A.

According to various embodiments, the display panel 103 may include a plurality of backlight modules 120 (e.g., the backlight module 120 of FIGS. 4 and 5A) and one color converter module 110 (e.g., the color converter module 110 of FIGS. 4 and 5A).

According to an embodiment, the display panel 103 may be manufactured by bonding the plurality of backlight modules 120 to one color converter module 110 through a first adhesive layer (e.g., the first adhesive layer 130 of FIGS. 4 and 5A).

According to an embodiment, each of the plurality of backlight modules 120 may have a first cross-sectional area in the first plane direction (e.g., the direction of the plane including the X axis and the Y axis of FIG. 9) which is perpendicular to the first direction (e.g., the Z-axis direction of FIG. 9) which is the thickness direction of the display panel 103.

According to an embodiment, one color converter module 110 may have a second cross-sectional area in the first plane direction (e.g., the direction of the plane including the X axis and the Y axis of FIG. 9).

According to an embodiment, the second cross-sectional area of the color converter module 120 may be larger than the first cross-sectional area of the backlight module 120.

Figure 10:
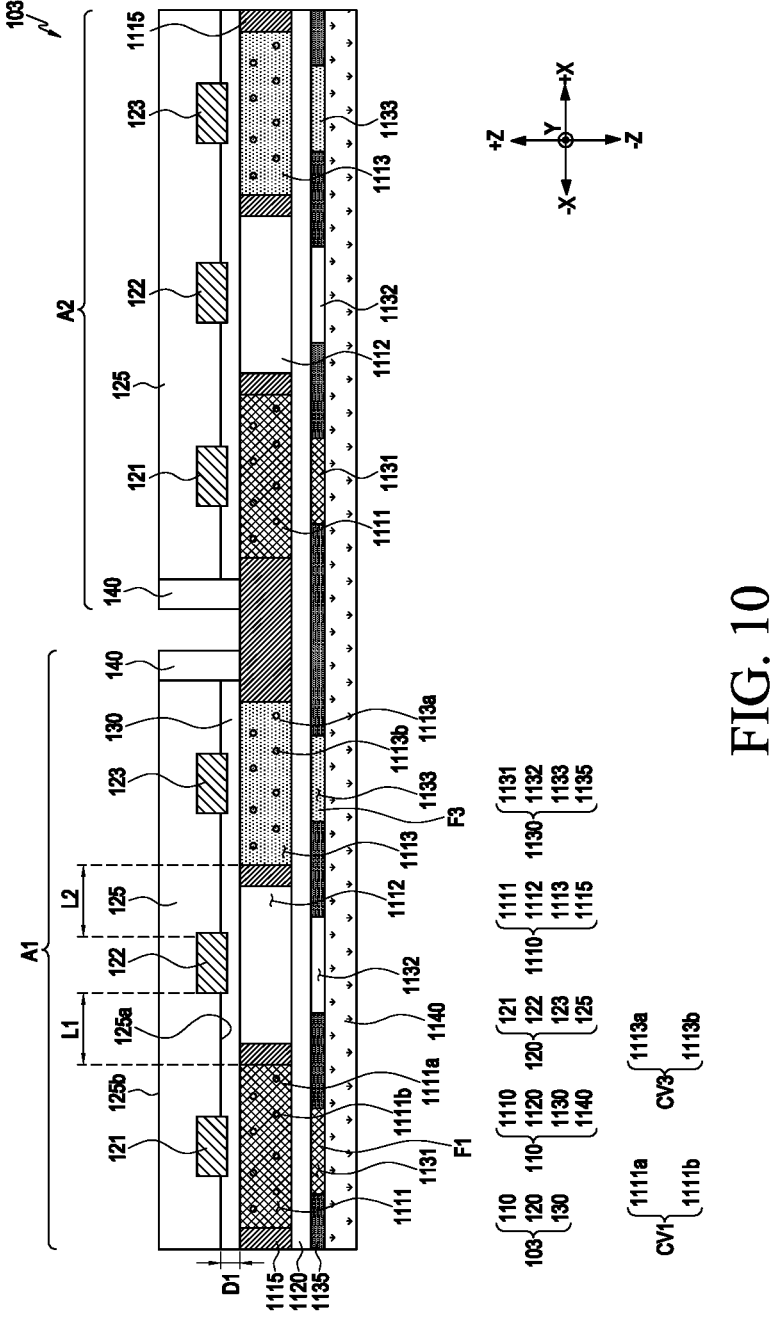
FIG. 10 is a cross-sectional view illustrating a coupled state of a backlight module and a color converter module according to various embodiments of the disclosure.

FIG. 10 is a cross-sectional view illustrating a coupled state of a backlight module and a color converter module according to various embodiments of the disclosure.

Referring to FIG. 10, a display panel 103 (e.g., the display panel 103 of FIGS. 2 to 5A or the display panel 103 of FIG. 9) may include a backlight module 120, a color converter module 110, and a first adhesive layer 130.

The configuration of the backlight module 120, the color converter module 110, and the first adhesive layer 130 of FIG. 10 may be identical in whole or part to the configuration of the backlight module 120, the color converter module 110, and the first adhesive layer 130 of FIG. 4.

According to various embodiments, the backlight module 120 (e.g., the backlight module 120 of FIG. 4) may include a first backlight module 120 (e.g., the backlight module 120 in portion A1 of FIG. 10) and a second backlight module 120 (e.g., the backlight module 120 in portion A2 of FIG. 10) disposed adjacent to the first backlight module 120 (e.g., the backlight module 120 in portion A1 of FIG. 10).

According to various embodiments, at least a portion of the color converter module 110 (e.g., the color converter module 110 of FIG. 4) may be stacked on the first backlight module 120 (e.g., the backlight module 120 in portion A1 of FIG. 10), and the rest of the color converter module 110 may be stacked on the second backlight module 120 (e.g., the backlight module 120 in portion A2 of FIG. 10).

According to an embodiment, the first backlight module 120 and/or the second backlight module 120 may have a first cross-sectional area, and the color converter module 110 may have a second cross-sectional area in the first plane direction (e.g., the direction of the plane including the X axis and the Y axis of FIG. 10) perpendicular to the first direction (e.g., the Z-axis direction of FIG. 10) which is the thickness direction of the display panel 103 may be substantially the same in size as each other. According to an embodiment, the size of the second cross-sectional area may be larger than the size of the first cross-sectional area.

According to an embodiment, the display panel 103 may be formed of a combination of a plurality of backlight modules 120 and one color converter modules 110 stacked on the plurality of backlight modules 120. According to an embodiment, the first backlight module 120 (e.g., the backlight module 120 in portion A1) may be spaced apart from its adjacent second backlight module 120 (e.g., the backlight module 120 in portion A2) by a designated distance. According to an embodiment, the first backlight module 120 (e.g., the backlight module 120 in portion A1) and the first color converter module 110 (e.g., the first color converter module 110 in portion A1) bonded to the first backlight module 120 may not be spaced apart from its adjacent second backlight module 120 (e.g., the backlight module 120 in portion A2) and the second color converter module 110 (e.g., the second color converter module 110 in portion A2) bonded to the second backlight module 120.

According to an embodiment, the boundary layer 140 may be disposed between the first backlight module 120 (e.g., the backlight module 120 in portion A1) and its adjacent second backlight module 120 (e.g., the backlight module 120 in portion A2). According to an embodiment, the boundary layer 140 may be formed of an organic layer having moisture resistance or an inorganic layer having moisture resistance. According to an embodiment, the boundary layer 140 may be coupled to a side of the backlight module 120, restricting inflow of an external foreign object and/or liquid to the side of the backlight module 120.

Figure 11A:
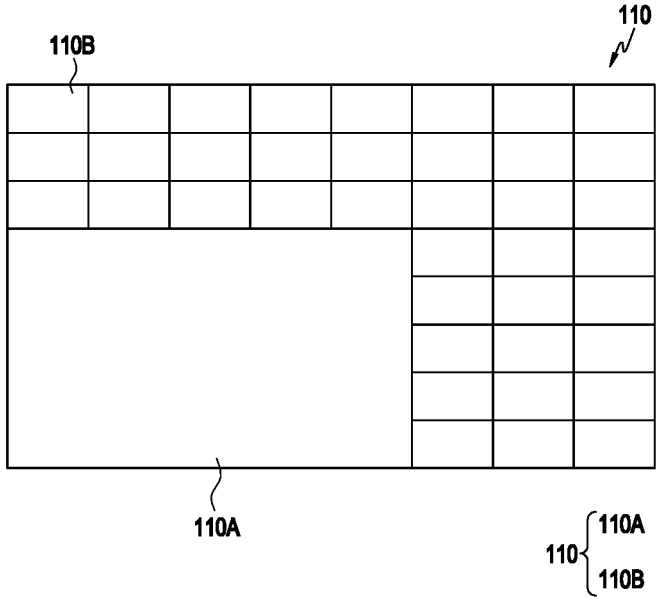
FIG. 11A is a view illustrating a plurality of color converter modules according to various embodiments of the disclosure.
Figure 11B:
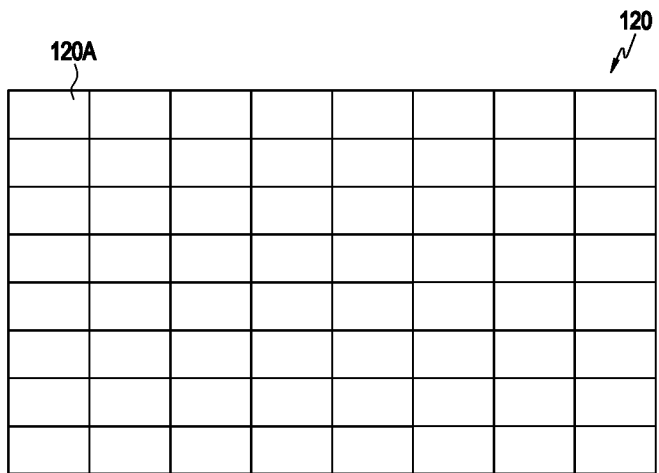
FIG. 11B is a view illustrating a plurality of backlight modules according to various embodiments of the disclosure.

FIG. 11A is a view illustrating a plurality of color converter modules according to various embodiments of the disclosure. FIG. 11B is a view illustrating a plurality of backlight modules according to various embodiments of the disclosure.

Referring to FIGS. 11A and/or 11B, a display panel (e.g., the display panel 103 of FIGS. 2 to 4) may include a color converter module 110 and/or a backlight module 120.

According to various embodiments, the color converter module 110 (e.g., the color converter module 110 of FIG. 4) may include a first color converter module 110A having a first cross-sectional area and a plurality of second color converter modules 110B having a second cross-sectional area smaller than the first cross-sectional area.

According to various embodiments, the backlight module 120 may include a plurality of backlight modules 120A having a third cross-sectional area.

According to an embodiment, each of the plurality of backlight modules 120A may have the same cross-sectional area as the third cross-sectional area.

According to an embodiment, the third cross-sectional area may be smaller than or substantially identical to the second cross-sectional area. According to an embodiment, the third cross-sectional area may be smaller than the first cross-sectional area.

According to an embodiment, the display panel may be manufactured by bonding a plurality of (e.g., 25) backlight modules 120A to the first color converter module 110A, bonding a plurality of (e.g., 39) backlight modules 120A to the second color converter module 110B, and tiling them. However, the above-described numbers are exemplary, and the disclosure is not limited thereto, but various numbers may be adopted in design.

Figure 12A:
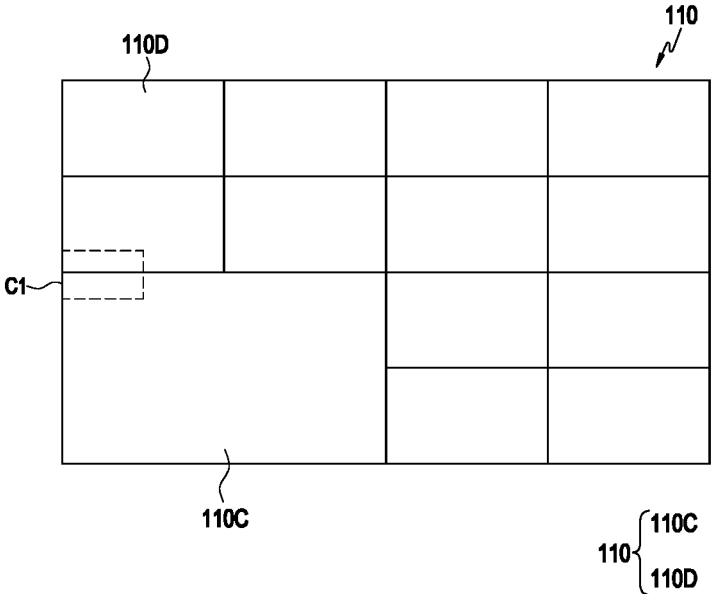
FIG. 12A is a view illustrating a plurality of color converter modules according to various embodiments of the disclosure.
Figure 12B:
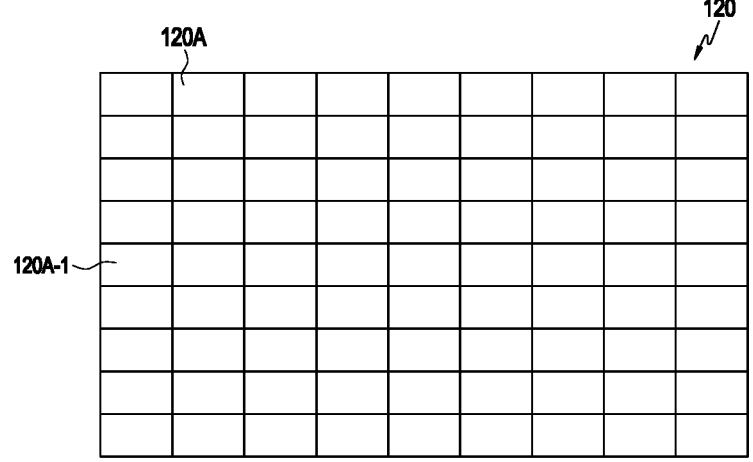
FIG. 12B is a view illustrating a plurality of backlight modules according to various embodiments of the disclosure.

FIG. 12A is a view illustrating a plurality of color converter modules according to various embodiments of the disclosure. FIG. 12B is a view illustrating a plurality of backlight modules according to various embodiments of the disclosure.

Referring to FIGS. 12A and/or 12B, a display panel (e.g., the display panel 103 of FIGS. 2 to 4) may include a color converter module 110 and/or a backlight module 120.

According to various embodiments, the color converter module 110 (e.g., the color converter module 110 of FIG. 4) may include a first color converter module 110C having a first cross-sectional area and a plurality of second color converter modules 110D having a second cross-sectional area smaller than the first cross-sectional area.

According to various embodiments, the backlight module 120 may include a plurality of backlight modules 120A having a third cross-sectional area.

According to an embodiment, each of the plurality of backlight modules 120A may have the same cross-sectional area as the third cross-sectional area.

According to an embodiment, the third cross-sectional area may be smaller than the second cross-sectional area. According to an embodiment, the third cross-sectional area may be smaller than the first cross-sectional area.

According to an embodiment, the display panel may be manufactured by tiling the plurality of second color converter modules 110D to the first color converter module 110C and bonding a plurality of backlight modules 120A to the plurality of second color converter modules 110D and the first color converter module 110C.

According to an embodiment, at least a portion of at least one (e.g., 120A-1) of the plurality of backlight modules 120A may be disposed on the first color converter module 110C, and the other portion may be disposed on any one of the second color converter modules 110D. For example, the backlight module 120A-1 of FIG. 12B may be disposed in the bonding area C1 of the portion where any one of the second color converter modules 110D and the first color converter module 110C abut each other. For example, some of the plurality of backlight modules 120A may be bonded simultaneously to the first color converter module 110C and the second color converter module 110D or simultaneously to a pair of second color converter modules 110D adjacent to each other.

According to various embodiments of the disclosure, a display panel (e.g., the display panel 103 of FIGS. 2 to 4) may comprise a backlight module (e.g., the backlight module 120 of FIG. 4) including a substrate (e.g., the substrate 125 of FIG. 4), a first light source member (e.g., the first light source member 121 of FIG. 4) disposed on a surface of a substrate, a second light source member (e.g., the second light source member 122 of FIG. 4) disposed on the surface of the substrate and adjacent to the first light source member, and a third light source member (e.g., the third light source member 123 of FIG. 4) disposed on the surface of the substrate and adjacent to the second light source member, a color converter module (e.g., the color converter module 110 of FIG. 4) stacked on the surface of the substrate and including a color converter layer (e.g., the color converter layer 1110 of FIG. 4), the color converter layer including a first pixel area (e.g., the first pixel area 1111 of FIG. 4) positioned to correspond to the first light source member, a second pixel area (e.g., the second pixel area 1112 of FIG. 4) positioned to correspond to the second light source member, a third pixel area (e.g., the third pixel area 1113 of FIG. 4) positioned to correspond to the third light source member and a quantum dot (e.g., the first quantum dot 1111b of FIG. 4 or the third quantum dot 1113b of FIG. 4) disposed in at least a portion of the first pixel area, the second pixel area, and the third pixel area, and a first adhesive layer (e.g., the first adhesive layer 130 of FIG. 4) disposed between the color converter module and the backlight module and having a first thickness (e.g., the first thickness D1 of FIG. 4). The first thickness may be smaller than a first distance (e.g., the first distance L1 of FIG. 4) which is a distance between the first pixel area and the second light source member. The first light source member, the second light source member, and the third light source member may be configured to emit light in substantially the same wavelength band.

According to various embodiments, the first thickness may be smaller than a second distance (e.g., the second distance L2 of FIG. 4) which is a distance between the second light source member and the third pixel area.

According to various embodiments, the first distance and the second distance may be substantially the same.

According to various embodiments, the first thickness may be a designated thickness in a first direction (e.g., the Z-axis direction of FIG. 4). The first distance may be a designated distance in a second direction (e.g., the X-axis direction of FIG. 4) perpendicular to the first direction.

According to various embodiments, the first distance may be 4.8 to 9.3 times the first thickness.

According to various embodiments, the color converter layer may further include a first barrier rib member (e.g., the first barrier rib member 1115 of FIGS. 4 and 5B) configured to divide the first pixel area, the second pixel area, and the third pixel area. The first barrier rib member may have a second thickness (e.g., the second thickness D2 of FIG. 5A) larger than the first thickness.

According to various embodiments, at least one of the first pixel area, the second pixel area, and the third pixel area may include a color converter (e.g., the first color converter CV1 of FIG. 4 or the third color converter CV3 of FIG. 4)

including a photosensitive resin (e.g., the first photosensitive resin 1111a of FIG. 4 or the third photosensitive resin 1113a of FIG. 4) and the quantum dot. The color converter may have a third thickness (e.g., the third thickness D3 of FIG. 5A) larger than the second thickness.

According to various embodiments, at least one of the first pixel area, the second pixel area, and the third pixel area may include a color converter (e.g., the first color converter CV1 of FIG. 4 or the third color converter CV3 of FIG. 4) including a photosensitive resin (e.g., the first photosensitive resin 1111a of FIG. 4 or the third photosensitive resin 1113a of FIG. 4) and the quantum dot. At least a portion of the color converter may have a third thickness (e.g., the third thickness D3 of FIG. 5B) smaller than the second thickness.

According to various embodiments, the color converter module may further include a color filter layer (e.g., the color filter layer 1130 of FIG. 4) stacked on the color converter layer. The color filter layer may further include a first color area (e.g., the first color area 1131 of FIG. 4) positioned to correspond to the first pixel area; a second color area (e.g., the second color area 1132 of FIG. 4) positioned to correspond to the second pixel area; a third color area (e.g., the third color area 1133 of FIG. 4) positioned to correspond to the third pixel area; a second barrier rib member (e.g., the second barrier rib member 1135 of FIG. 4) configured to divide the first color area, the second color area, and the third color area; and a color filter (e.g., the first color filter F1 of FIG. 4 or the third color filter F3 of FIG. 4) disposed in at least a portion of the first color area, the second color area, and the third color area.

According to various embodiments, the color converter module may further include a transparent coating layer (e.g., the transparent coating layer 1120 of FIG. 4) disposed between the color converter layer and the color filter layer.

According to various embodiments, the color converter module may further include a cover glass (e.g., the cover glass 1140 of FIG. 4) stacked on the color filter layer.

According to various embodiments, the backlight module may have a first cross-sectional area in a first plane direction (e.g., the direction of the plane including the X axis and the Y axis of FIG. 6 or the direction of the plane including the X axis and the Y axis of FIG. 9) which is a plane direction perpendicular to a first direction (e.g., the Z-axis direction of FIG. 6 or the Z-axis direction of FIG. 9) which is a thickness direction of the display panel. The color converter module may have a second cross-sectional area in the first plane direction. A size of second cross-sectional area may be substantially the same as a size of the first cross-sectional area (e.g., see FIG. 6 or 7) or larger than a size of the first cross-sectional area (e.g., see FIG. 9 or 10).

According to various embodiments, the backlight module may include a first backlight module (e.g., the backlight module 120 in portion A1 of FIG. 7) and a second backlight module (e.g., the backlight module 120 in portion A2 of FIG. 7) disposed adjacent to the first backlight module. The color converter module may include a first color converter module (e.g., the color converter module 110 in portion A1 of FIG. 7) stacked on the first backlight module and a second color converter module (e.g., the color converter module 110 in portion A2 of FIG. 7) stacked on the second backlight module.

According to various embodiments, the backlight module may include a first backlight module (e.g., the backlight module 120 in portion A1 of FIG. 10) and a second backlight module (e.g., the backlight module 120 in portion A2 of FIG. 10) disposed adjacent to the first backlight module. At least a portion of the color converter module (e.g., the color converter module 110 of FIG. 10) may be stacked on the first backlight module, and a remaining portion of the color converter module may be stacked on the second backlight module.

According to various embodiments, the color converter module may include a first color converter module (e.g., the first color converter module 110C of FIG. 12A) and a second color converter module (e.g., the second color converter module 110D of FIG. 12A) disposed adjacent to the first color converter module. At least a portion of the backlight module (e.g., the backlight module 120A-1 of FIG. 12B) may be disposed on the first color converter module, and a remaining portion of the backlight module may be disposed on the second color converter module.

According to various embodiments of the disclosure, a display panel (e.g., the display panel 103 of FIGS. 2 to 4) may comprise a backlight module (e.g., the backlight module 120 of FIG. 4) including a substrate (e.g., the substrate 125 of FIG. 4), a first light source member (e.g., the first light source member 121 of FIG. 4) disposed on a surface of a substrate, a second light source member (e.g., the second light source member 122 of FIG. 4) disposed on the surface of the substrate and adjacent to the first light source member, and a third light source member (e.g., the third light source member 123 of FIG. 4) disposed on the surface of the substrate and adjacent to the second light source member, a color converter layer (e.g., the color converter layer 1110 of FIG. 4) stacked on the surface of the substrate and including a first pixel area (e.g., the first pixel area 1111 of FIG. 4) positioned to correspond to the first light source member and configured to convert a wavelength band of light emitted from the first light source member, a second pixel area (e.g., the second pixel area 1112 of FIG. 4) positioned to correspond to the second light source member, and a third pixel area (e.g., the third pixel area 1113 of FIG. 4) positioned to correspond to the third light source member and configured to convert a wavelength band of light emitted from the third light source member; and a color filter layer (e.g., the color filter layer 1130 of FIG. 4) stacked on one surface of the color converter layer and including a first color filter (e.g., the first color filter F1 of FIG. 4) positioned to correspond to the first pixel area and a second color filter (e.g., the third color filter F3 of FIG. 4) positioned corresponding to the third pixel area. The first light source member, the second light source member, and the third light source member may be configured to emit light in substantially the same wavelength band.

According to various embodiments, the display panel may further comprise a first adhesive layer (e.g., the first adhesive layer 130 of FIG. 4) disposed between the backlight module and the color converter layer and configured to adhere the backlight module to the color converter layer. A thickness (e.g., the first thickness D1 of FIG. 4) of the first adhesive layer may be smaller than a distance (e.g., the first distance L1 of FIG. 4) between the first pixel area and the second light source member.

According to various embodiments, the display panel may further comprise a cover glass (e.g., the cover glass 1140 of FIG. 4) stacked on the color filter layer; and a transparent coating layer (e.g., the transparent coating layer 1120 of FIG. 4) disposed between the color filter layer and the cover glass.

According to various embodiments, the first light source member, the second light source member, and the third light source member may include a blue micro LED configured to emit light in a blue wavelength band. The first pixel area may include a first quantum dot (e.g., the first quantum dot 1111b of FIG. 4) configured to convert a wavelength band of light emitted from the first light source member into a red wavelength band or a green wavelength band. The third pixel area may include a second quantum dot (e.g., the third quantum dot 1113b of FIG. 4) configured to convert a wavelength band of light emitted from the third light source member into a green wavelength band or a red wavelength band.

According to various embodiments of the disclosure, a display device (e.g., the display device 100 of FIGS. 1 and 2) may comprise a backlight module (e.g., the backlight module 120 of FIG. 4) including a substrate (e.g., the substrate 125 of FIG. 4), a first light source member (e.g., the first light source member 121 of FIG. 4) disposed on a surface of a substrate, a second light source member (e.g., the second light source member 122 of FIG. 4) disposed on the surface of the substrate and adjacent to the first light source member, and a third light source member (e.g., the third light source member 123 of FIG. 4) disposed on the surface of the substrate and adjacent to the second light source member; a color converter module (e.g., the color converter module 110 of FIG. 4) stacked on the surface of the substrate and including a color converter layer (e.g., the color converter layer 1110 of FIG. 4), the color converter layer including a first pixel area (e.g., the first pixel area 1111 of FIG. 4) positioned to correspond to the first light source member, a second pixel area (e.g., the second pixel area 1112 of FIG. 4) positioned to correspond to the second light source member, a third pixel area (e.g., the third pixel area 1113 of FIG. 4) positioned to correspond to the third light source member, and a quantum dot (e.g., the first quantum dot 1111b of FIG. 4 or the third quantum dot 1113b of FIG. 4) disposed in at least a portion of the first pixel area, the second pixel area, and the third pixel area, and a first adhesive layer (e.g., the first adhesive layer 130 of FIG. 4) disposed between the color converter module and the backlight module and having a first thickness (e.g., the first thickness D1 of FIG. 4). The first thickness may be smaller than a first distance (e.g., the first distance L1 of FIG. 4) which is a distance between the first pixel area and the second light source member. The first light source member, the second light source member, and the third light source member may be configured to emit light in substantially the same wavelength band.

While the disclosure has been shown and described with reference to exemplary embodiments thereof, it will be apparent to those of ordinary skill in the art that various changes in form and detail may be made thereto without departing from the spirit and scope of the disclosure as defined by the following claims.

What is claimed is:

1. A display panel comprising:
a backlight module comprising a substrate, a first light source member disposed on a surface of the substrate, a second light source member disposed on the surface of the substrate and adjacent to the first light source member, and a third light source member disposed on the surface of the substrate and adjacent to the second light source member;
a color converter module adhered to the backlight module and comprising a color converter layer and a color filter layer; and
a first adhesive layer disposed between the color converter module and the backlight module and having a first thickness,
wherein the color converter layer comprises:

a first pixel area corresponding to the first light source member and including a first color converter, a second pixel area corresponding to the second light source member, a third pixel area corresponding to the third light source member and including a third color converter, a first barrier rib member dividing the first pixel area, the second pixel area and the third pixel area, and a quantum dot disposed in at least one of the first pixel area, the second pixel area, and the third pixel area, wherein the color filter layer is spaced from the color converter layer in a direction away from the backlight module and includes a second barrier rib member forming an opening corresponding to the second pixel area and spaced apart from the first barrier rib member in the direction away from the backlight module, wherein the first color converter and the first barrier rib member form a first surface such that an end of the first color converter facing the backlight module and an end of the first barrier rib member facing the backlight module are continuously connected, wherein the third color converter and the first barrier rib member form a second surface such that an end of the third color converter facing the backlight module and another end of the first barrier rib member facing the backlight module are continuously connected, wherein at least a portion of the first adhesive layer is disposed on the first surface and the second surface between the color converter module and the backlight module, wherein the first thickness is smaller than a first distance between the first pixel area and the second light source member, and wherein each of the first light source member, the second light source member, and the third light source member is configured to emit light in substantially a same wavelength band.

2. The display panel of claim 1, wherein the first thickness is smaller than a second distance between the second light source member and the third pixel area.

3. The display panel of claim 2, wherein the first distance and the second distance are substantially the same.

4. The display panel of claim 1, wherein the first thickness is a designated thickness in a first direction, and wherein the first distance is a designated distance in a second direction perpendicular to the first direction.

5. The display panel of claim 4, wherein the first distance is 4.8 to 9.3 times the first thickness.

6. The display panel of claim 1, wherein the first barrier rib member has a second thickness larger than the first thickness.

7. The display panel of claim 6, wherein at least one of the first pixel area, the second pixel area, and the third pixel area comprises a color converter comprising a photosensitive resin and the quantum dot, and wherein at least a portion of the color converter has a third thickness larger than the second thickness.

8. The display panel of claim 6, wherein at least one of the first pixel area, the second pixel area, and the third pixel area comprises a color converter comprising a photosensitive resin and the quantum dot, and wherein at least a portion of the color converter has a third thickness smaller than the second thickness.

9. The display panel of claim 1, wherein the color filter layer further comprises:

a first color area corresponding to the first pixel area, a second color area corresponding to the second pixel area, a third color area corresponding to the third pixel area, and a color filter disposed in at least one of the first color area, the second color area, and the third color area, and wherein the second barrier rib member divides the first color area, the second color area, and the third color area.

10. The display panel of claim 9, wherein the color converter module further comprises a transparent coating layer disposed between the color converter layer and the color filter layer.

11. The display panel of claim 9, wherein the color converter module further comprises a cover glass disposed on the color filter layer.

12. The display panel of claim 1, wherein the backlight module has a first cross-sectional area in a first plane direction which is a plane direction perpendicular to a first direction which is a thickness direction of the display panel, wherein the color converter module has a second cross-sectional area in the first plane direction, and wherein a size of the second cross-sectional area is substantially a same as a size of the first cross-sectional area or larger than a size of the first cross-sectional area.

13. The display panel of claim 1, wherein the backlight module comprises a first backlight module and a second backlight module disposed adjacent to the first backlight module, and wherein the color converter module further comprises a first color converter module disposed on the first backlight module and a second color converter module disposed on the second backlight module.

14. The display panel of claim 1, wherein the backlight module comprises a first backlight module and a second backlight module disposed adjacent to the first backlight module, and wherein at least a portion of the color converter module is disposed on the first backlight module, and a remaining portion of the color converter module is disposed on the second backlight module.

15. The display panel of claim 1, wherein the color converter module comprises a first color converter module and a second color converter module disposed adjacent to the first color converter module, and wherein at least a portion of the backlight module is disposed on the first color converter module, and a remaining portion of the backlight module is disposed on the second color converter module.

16. The display panel of claim 1, wherein each of the first light source member, the second light source member, and the third light source member comprises a blue micro LED configured to emit light in a blue wavelength band, wherein the first pixel area comprises a first quantum dot configured to convert a wavelength band of light emitted from the first light source member into a red wavelength band or a green wavelength band, and wherein the third pixel area comprises a second quantum dot configured to convert a wavelength band of light emitted from the third light source member into a green wavelength band or a red wavelength band.

17. A display device comprising:

a backlight module comprising a substrate, a first light source member disposed on a surface of the substrate, a second light source member disposed on the surface of the substrate and adjacent to the first light source member, and a third light source member disposed on the surface of the substrate and adjacent to the second light source member;

a color converter module disposed on the surface of the substrate and comprising a color converter layer; and a first adhesive layer disposed between the color converter module and the backlight module and having a first thickness, wherein the color converter layer comprises:

a first pixel area corresponding to the first light source member and including a first color converter, a second pixel area corresponding to the second light source member, a third pixel area corresponding to the third light source member and including a third color converter, and a quantum dot disposed in the first pixel area, and the third pixel area, wherein the first color converter and a first barrier rib member form a first surface such that an end of the first color converter facing the backlight module and an end of the first barrier rib member facing the backlight module are continuously connected, wherein the third color converter and the first barrier rib member form a second surface that an end of the third color converter facing the backlight module and another end of the first barrier rib member facing the backlight module are continuously connected, wherein at least a portion of the first adhesive layer is disposed on the first surface and the second surface between the color converter module and the backlight module, wherein the first thickness is smaller than a first distance between the first pixel area and the second light source member, and wherein each of the first light source member, the second light source member, and the third light source member is configured to emit light in substantially a same wavelength band.

* * * * *